(12) United States Patent
Lensing

(10) Patent No.: US 6,630,362 B1
(45) Date of Patent: *Oct. 7, 2003

(54) METHOD AND APPARATUS FOR PERFORMING TRENCH DEPTH ANALYSIS

(75) Inventor: Kevin R. Lensing, Austin, TX (US)

(73) Assignee: Advanced Micro Devices, Inc., Austin, TX (US)

(*) Notice: Subject to any disclaimer, the term of this patent is extended or adjusted under 35 U.S.C. 154(b) by 124 days.

This patent is subject to a terminal disclaimer.

(21) Appl. No.: 09/880,990

(22) Filed: Jun. 13, 2001

(51) Int. Cl.[7] ............................................. H01L 21/66
(52) U.S. Cl. ............................ 438/14; 438/15; 356/445
(58) Field of Search ........................ 438/14–16; 356/445, 356/376, 351, 349

(56) References Cited

U.S. PATENT DOCUMENTS

| | | | |
|---|---|---|---|
| 4,710,642 A | * 12/1987 | McNeil | 250/559.04 |
| 5,164,790 A | * 11/1992 | McNeil et al. | 356/496 |
| 5,241,369 A | * 8/1993 | McNeil et al. | 356/445 |
| 5,703,692 A | * 12/1997 | McNeil et al. | 356/445 |
| 5,867,276 A | * 2/1999 | McNeil et al. | 356/445 |
| 5,877,276 A | * 3/1999 | Talmadge | 530/324 |
| 5,880,838 A | * 3/1999 | Marx et al. | 356/498 |
| 5,923,423 A | * 7/1999 | Sawatari et al. | 356/484 |
| 5,955,654 A | * 9/1999 | Stover et al. | 73/1.89 |
| 6,051,348 A | 4/2000 | Marinaro et al. | 430/30 |
| 6,245,584 B1 | 6/2001 | Marinaro et al. | 438/14 |
| 6,259,521 B1 | * 7/2001 | Miller et al. | 356/237.5 |
| 6,383,824 B1 | * 5/2002 | Lensing | 438/14 |

* cited by examiner

Primary Examiner—John F. Niebling
Assistant Examiner—Olivia Luk
(74) Attorney, Agent, or Firm—Williams, Morgan & Amerson, P.C.

(57) ABSTRACT

A method and an apparatus for performing trench depth analysis in semiconductor device manufacturing. A first processing on at least one semiconductor wafer is performed. Optical trench data is acquired from the processed semiconductor wafer. An optical trench analysis, based upon the optical trench data, is performed. A corrective feedback step is performed during a second processing of the semiconductor wafer in response to the optical trench analysis.

15 Claims, 10 Drawing Sheets

METHOD AND APPARATUS FOR PERFORMING TRENCH DEPTH ANALYSIS

BACKGROUND OF THE INVENTION

1. Field of the Invention

This invention relates generally to semiconductor manufacturing, and, more particularly, to a method and apparatus for performing optical analysis of trench depositions.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed on a group of semiconductor wafers, sometimes referred to as a lot, using a semiconductor manufacturing tool called an exposure tool or a stepper. Typically, an etch process is then performed on the semiconductor wafers to form objects on the semiconductor wafer, each of which may function as a gate electrode for a transistor. Typically, shallow trench isolation (STI) structures formed on the semiconductor wafers being processed are filled by forming silicon oxide using tetraethoxysilane (TEOS), over the STI structures. The manufacturing tools communicate with a manufacturing framework or a network of processing modules. Each manufacturing tool is generally connected to an equipment interface. The equipment interface is connected to a machine interface to which a manufacturing network is connected, thereby facilitating communications between the manufacturing tool and the manufacturing framework. The machine interface can generally be part of an advanced process control (APC) system. The APC system initiates a control script, which can be a software program that automatically retrieves the data needed to execute a manufacturing process.

FIG. 1 illustrates a typical semiconductor wafer 105. The wafer 105 typically includes a plurality of individual semiconductor die arranged in a grid 150. Photolithography steps are typically performed by a stepper on approximately one to four die locations at a time, depending on the specific photomask employed. Photolithography steps are generally performed to form patterned layers of photoresist above one or more process layers that are to be patterned. The patterned photoresist layer can be used as a mask during etching processes, wet or dry, performed on the underlying layer or layers of material, e.g., a layer of polysilicon, metal or insulating material, to transfer the desired pattern to the underlying ayer. The patterned layer of photoresist is comprised of a plurality of features, e.g., line-type features, such as a polysilicon line, or opening-type features, that are to be replicated in an underlying process layer.

Turning now to FIG. 2, a silicon substrate 210 that contains a plurality of layers 220, 230, is shown. In one embodiment, a layer of silicon nitride is added on the surface 215 of the silicon substrate 210, producing the layer 220. Trenches 240 are formed extending through layer 220 of silicon nitride and into the silicon substrate 210. Any of a variety of etching processes may be employed to create the trench 240. The trenches 240 in the silicon substrate 210 generally have a finite trench thickness 250. The trench thickness 250 extends from the bottom of the trench 240 to a top surface of the layer 220.

FIG. 2 also illustrates a pre-polished layer of TEOS material deposited on the silicon substrate 210, which is represented by layer 230. Typically, a layer of silicon dioxide is formed on the silicon substrate 210 and the silicon nitride layer 220, creating the layer 230. Ideally, the TEOS filling completely fills the trench thickness 250 (i.e., the thickness of the TEOS filling equals to the trench thickness 250).

Turning now to FIG. 3, a TEOS layer 230 is illustrated at a point in the manufacturing process where it has been polished down to approximately the trench thickness 250. The polishing process may leave the TEOS layer 230 with a thickness 350 that does not equal to the trench thickness 250. Furthermore, a dishing effect 310 (e.g., uneven filling of a trench) results from the polishing of the EOS layer 230. Generally, the polish process is controlled by measuring the trench thickness 250 and the fill thickness 350 and calculating a difference between the two thicknesses 250, 350. However, this process of calculating the difference in the thicknesses can cause errors during processing of semiconductor wafers.

The present invention is directed to overcoming, or at least reducing the effects of, one or more of the problems set forth above.

SUMMARY OF THE INVENTION

In one aspect of the present invention, a method is provided for performing trench depth analysis in semiconductor device manufacturing. A first processing on at least one semiconductor wafer is performed. Optical trench data is acquired from the processed semiconductor wafer. An optical trench analysis, based upon the optical trench data, is performed. A corrective feedback step is performed during a second processing of the semiconductor wafer in response to the optical trench analysis.

In another aspect of the present invention, a system is provided for performing trench depth analysis in semiconductor device manufacturing. The system of the present invention comprises: a computer system; a manufacturing model coupled with the computer system, the manufacturing model being capable of generating and modifying at least one control input parameter signal; a machine interface coupled with the manufacturing model, the machine interface being capable of receiving process recipes from the manufacturing model; a processing tool capable of processing semiconductor wafers and coupled with the machine interface, the first processing tool being capable of receiving at least one control input parameter signal from the machine interface; a metrology tool coupled with the first processing tool and the second processing tool, the metrology tool being capable of acquiring metrology data; an optical data reference library, the scatterometry reference library comprising optical data related to a plurality trench data; and an optical data error analysis unit coupled to the metrology tool and the optical data reference library, the optical data error analysis unit capable of comparing the metrology data to corresponding data in the optical data reference library and calculating at least one trench error.

BRIEF DESCRIPTION OF THE DRAWINGS

The invention may be understood by reference to the following description taken in conjunction with the accompanying drawings, in which like reference numerals identify like elements, and in which.

Figure 1:
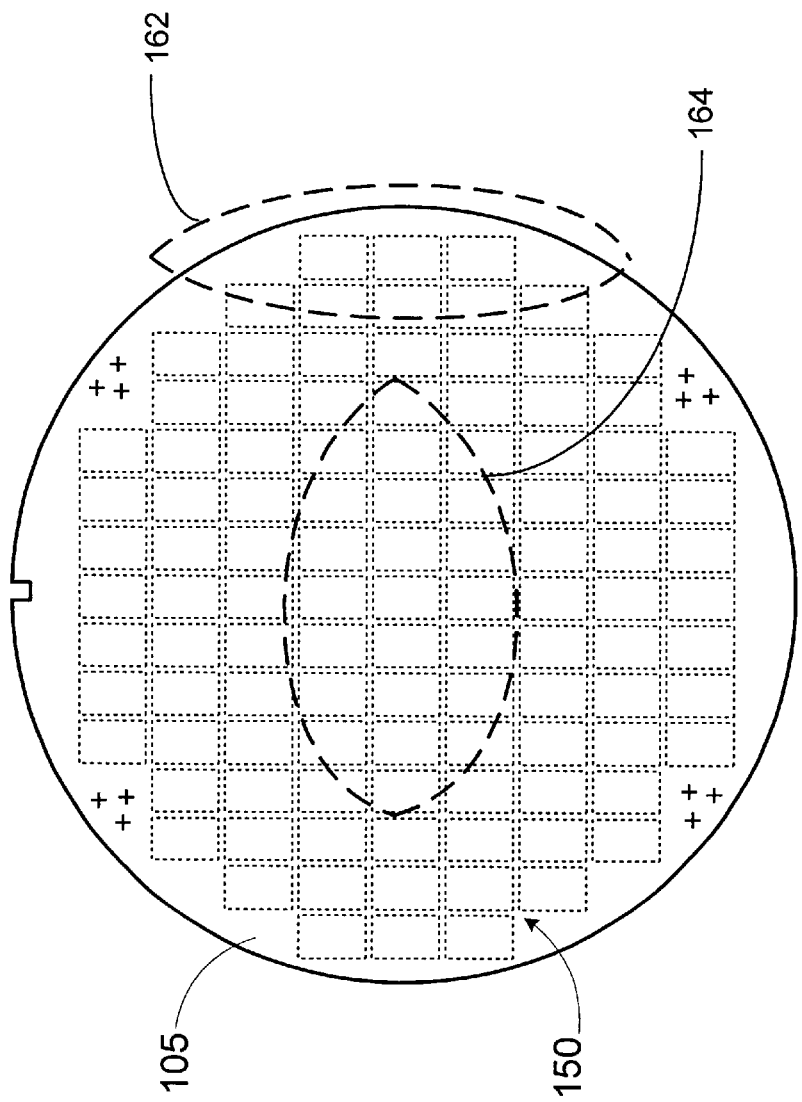
FIG. 1 is a simplified diagram of a prior art semiconductor wafer being processed.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discreet processes that are involved in semiconductor manufacturing. Many times, semiconductor devices are stepped through multiple manufacturing process tools. Errors can occur during the formation and filling of structures, such as STI structures, on semiconductor wafers being processed, which can cause significant degradation of the wafers being manufactured. Embodiments of the present invention utilize an optical data acquisition tool, such as a reflectometer, an ellipsometer, a scatterometry modeling tool, and the like, to detect and/or to reduce errors that may occur during filling and polishing processes.

Figure 4:
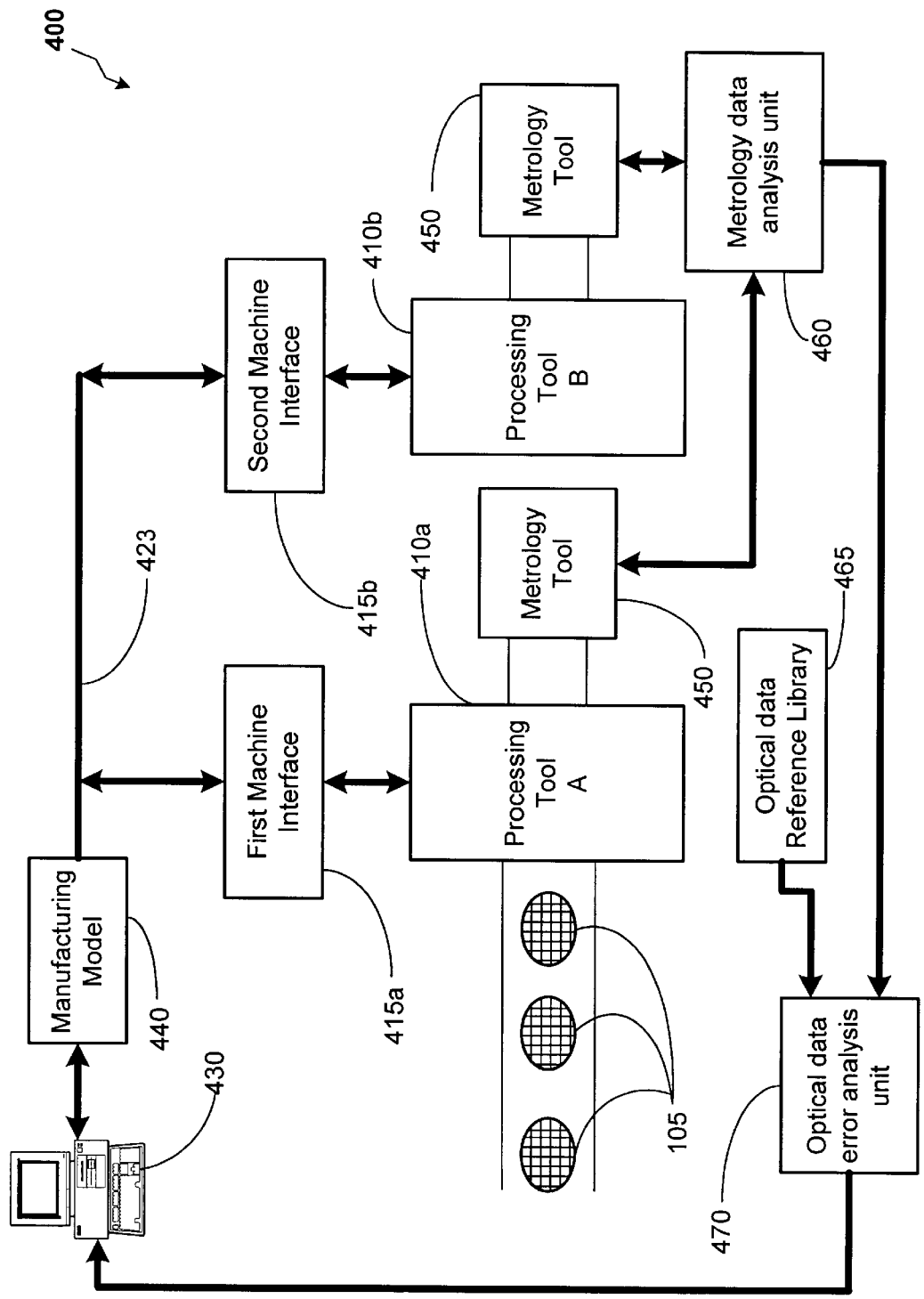
FIG. 4 is a block diagram representation of a system in accordance with one embodiment of the present invention.

Semiconductor devices are processed in a manufacturing environment using a number of input control parameters. Turning now to FIG. 4, a system 400 in accordance with one embodiment of the present invention is illustrated. In one embodiment, semiconductor wafers 105, are processed on processing tools 410a, 410b using a plurality of control input signals, or manufacturing parameters, on a line 423. In one embodiment, control input signals, or manufacturing parameters, on the line 423 are sent to the processing tools 410a, 410b from a computer system 430 via machine interfaces 415a, 415b. In one embodiment, the first and second machine interfaces 415a, 415b are located outside the processing tools 410a, 410b. In an alternative embodiment, the first and second machine interfaces 415a, 415b are located within the processing tools 410a, 410b.

In one embodiment, the computer system 430 sends control input signals, or manufacturing parameters, on the line 423 to the first and second machine interfaces 415a, 415b. The computer system 430 employs a manufacturing model 440 to generate the control input signals on the line 423. In one embodiment, the manufacturing model 440 contains a manufacturing recipe that determines a plurality of control input parameters that are sent on the line 423.

In one embodiment, the manufacturing model 440 defines a process script and input control that implement a particular manufacturing process. The control input signals on the line 423 that are intended for processing tool A 410a are received and processed by the first machine interface 415a. The control input signals on the line 423 that are intended for processing tool B 410b are received and processed by the second machine interface 415b. Examples of the processing tools 410 used in semiconductor manufacturing processes are steppers, step-and-scan tools, etch process tools, and the like.

One or more of the semiconductor wafers 105 that are processed by the processing tools 410a, 410b can also be sent to a metrology tool 450 for acquisition of metrology data. The metrology tool 450 can be a scatterometry data acquisition tool, an overlay-error measurement tool, a critical dimension measurement tool, and the like. In one embodiment, one or more processed semiconductor wafers 105 are examined by the metrology tool 450. Data from the metrology tool 450 is collected by a metrology data analyzer unit 460. The metrology data analyzer unit 460 organizes, analyses, and correlates scatterometry metrology data acquired by the metrology tool 450 to particular semiconductor wafers 105 that were examined. The metrology data analyzer unit 460 can be a software unit, a hardware unit, or a firmware unit. In one embodiment, the metrology data analyzer unit 460 is integrated into the computer system 430 or may be integrated into the metrology tool 450.

The system 400 comprises an optical data reference library 465. In one embodiment, the optical data reference library 465 comprises data relating to calculated optical data of a plurality of structures on a semiconductor wafer 105. In an alternative embodiment, the optical data reference library 465 comprises data relating to reflected optical data that occurs in response to optical stimuli engaged upon particular structures on a semiconductor wafer 105. A record that contains the response to optical stimuli performed on a plurality of structures, can be organized and stored in the optical data reference library 465, and used as reference for comparison of actual wafer data during manufacturing processes.

The particular reflection profile expected for any structure on a semiconductor wafer 105 depends on the specific geometry of the structure and the parameters of the measurement technique employed by the metrology tool 450, such as a scatterometry tool. The reflection profile for a particular structure includes the bandwidth of the reflected light, the angle of incidence, the intensity and phase of detected light, and the like. The profiles in the optical data reference library 465 are typically calculated theoretically by employing Maxwell's equations based on the characteristics of the structures on the semiconductor wafer 105. It is also contemplated that profiles in the optical data reference library 465 may be confirmed empirically by measuring reflection profiles of sample wafers and subsequent characterization of the measured wafers by destructive or non-destructive examination techniques.

A scatterometry error analysis unit 470 is capable of comparing the metrology data from the metrology data acquisition unit 460 to corresponding data from the optical data reference library 465 and determining if a significant error exists on the structure being analyzed. In one embodiment, the scatterometry error analysis unit 470 is a software unit that resides within the computer system 430. In an alternative embodiment, the scatterometry error analysis unit 470 is a hardware unit that is integrated into the system 400. In yet another embodiment, the scatterometry error analysis unit 470 is a firmware unit integrated within the system 400. The scatterometry error analysis unit 470 can be used by the system 400 to perform fault analysis of the semiconductor wafers 105 being manufactured, which is described in greater detail below. The scatterometry error analysis unit 470 can also be used by the system 400 for feedback process control, which is described in greater detail below.

Figure 5:
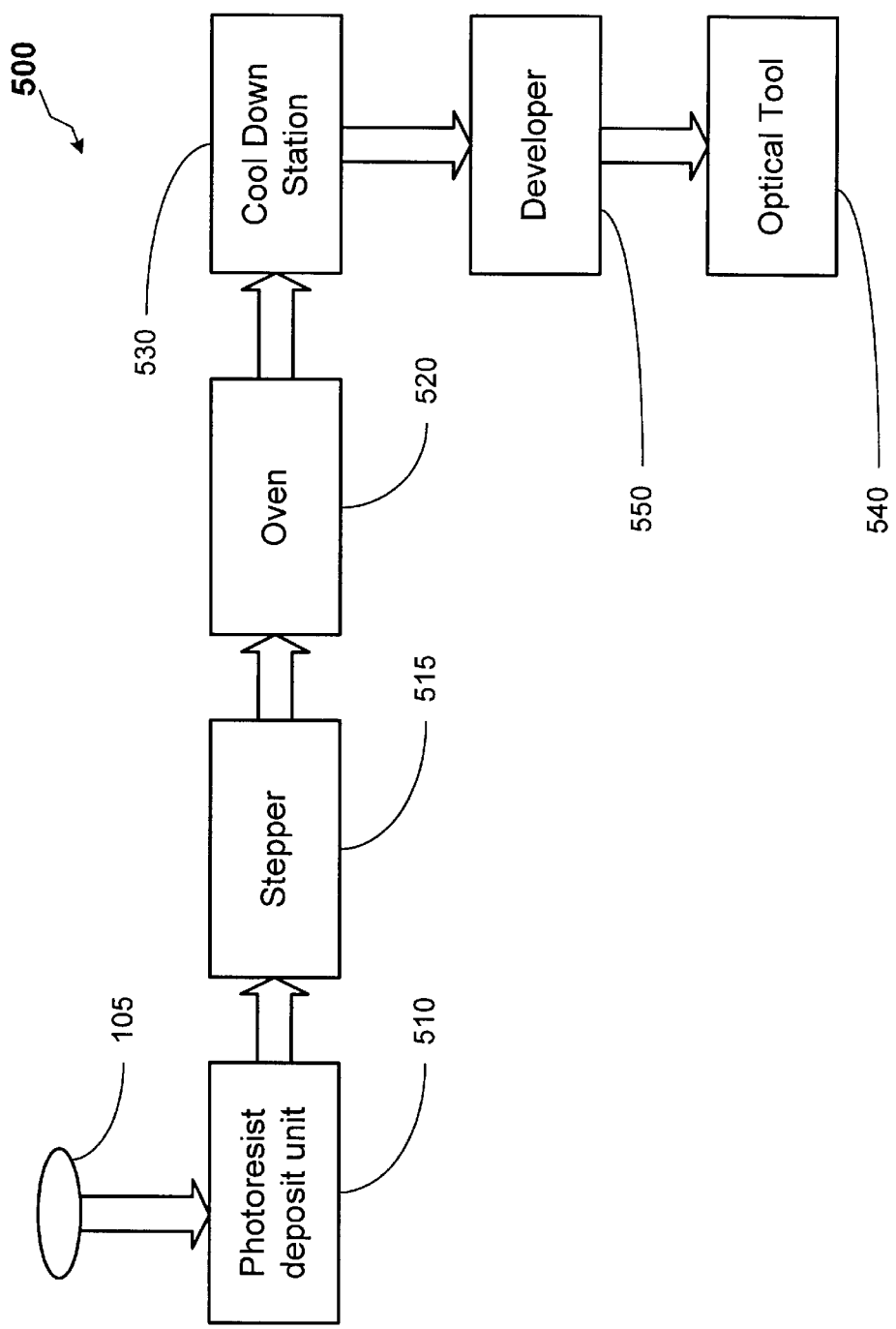
FIG. 5 illustrates one embodiment of a process flow in accordance with one embodiment of the present invention.

One embodiment of an implementation of a scatterometry metrology sequence in the context of semiconductor wafer manufacturing, is shown in FIG. 5, wherein an illustrative processing line 500 for performing photolithography patterning is depicted. The example illustrated in FIG. 5 can be used to optically analyze pre-polish and post-polish process results. The processing line 500 includes a photoresist deposition unit 510, a stepper 515, an oven 520, a cool down station 530, a developer 550, and an optical tool 540. The photoresist deposition unit 510 receives a semiconductor wafer 105, and forms a layer of photoresist of a predetermined thickness above a process layer formed above the surface of the wafer 105. The stepper 515 then receives the wafer 105 and exposes the photoresist to a light source using a reticle to pattern the layer of photoresist. The wafer 105 is transferred to the oven 520, where a post exposure bake process is conducted. Following the post exposure bake, the wafer 105 is transferred to the cool down station 530, and then to the developer station 550 after the wafer 105 has sufficiently cooled. The soluble photoresist material is removed from the wafer 105 in the developer station 550, thereby resulting in a patterned layer of photoresist.

The wafer 105 is then transferred to the optical tool 540 for measurements. As described in greater detail below, the optical tool 540 measures the wafer 105 to determine the acceptability and/or uniformity of the previously performed photolithography processes. The computer system 430, which is integrated with the APC framework, based on the wafer measurements, can adjust the recipe of the stepper 515, as needed. As will be recognized by those of ordinary skill in the art in light of this disclosure, the processing line 500 may include discrete or integrated processing tools for performing the processing steps described herein. The data acquired by the optical tool 540 is used for making modifications to the control input signals on the line 423, which control the processing tools 410.

Figure 6:
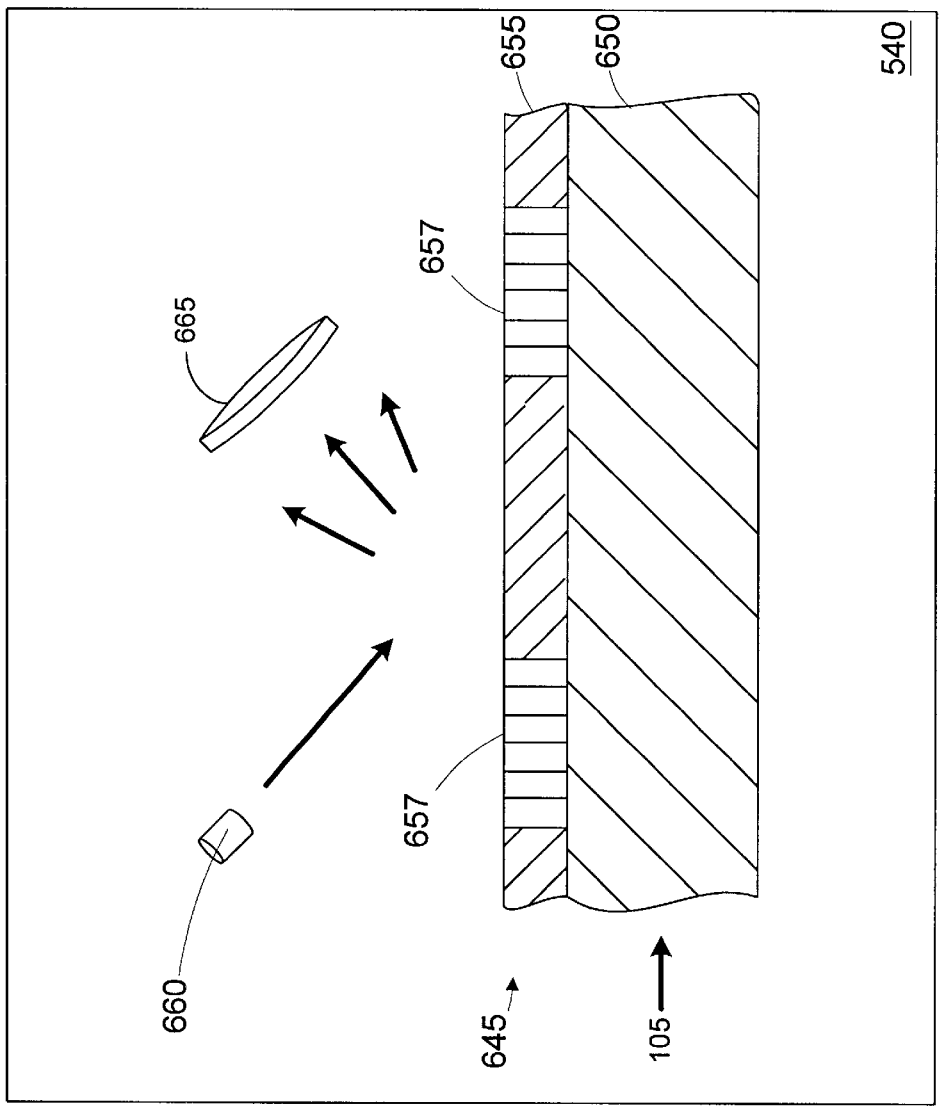
FIG. 6 illustrates a simplified view of a scatterometer with the semiconductor wafer loaded therein.

Referring to FIG. 6, a simplified view of an illustrative optical tool 540 with the wafer 105 loaded therein is provided. The wafer 105 has a base material 650.

The photoresist layer 655 has regions 657 formed on the base material 650 resulting from the previous exposure and baking steps (i.e., referred to as a patterned photoresist layer 655). The chemical change resulting in the change in solubility of the regions 657 also results in the regions 657 having an index of refraction different than that of the unexposed portions of the photoresist layer 655.

In one embodiment, the optical tool 540 (e.g., reflectometer, ellipsometer, scatterometry measurement tool, etc.) comprises a light source 660 and a detector 665 positioned proximate the wafer 105. The light source 660 of the optical tool 540 illuminates at least a portion of the wafer 105, and the detector 665 takes optical measurements, such as intensity, of the reflected light. Although the invention is described using a optical tool 540 designed to measure reflected light intensity, it is contemplated that other measurement tools, such as an ellipsometer, a reflectometer, a spectrometer, or some other light-measuring device may be used. It is also contemplated that the optical tool 540 may use monochromatic light, white light, or some other wavelength or combinations of wavelengths, depending on the specific implementation. The angle of incidence of the light may also vary, depending on the specific implementation.

The differences in the refractive indices for the regions 657 and the unexposed portions of the photoresist layer 655 cause light scattering, resulting in a decrease in the intensity of the reflected light as compared to scattering in the photoresist layer 655 before exposure and/or baking. The optical tool 540 measures the intensity at different points on the wafer 105, such as on the periphery and in the middle. A difference in the light intensity between various points indicates a nonconformity, such as a variation in the line widths of the regions 657. The light analyzed by the optical tool 540 typically includes a reflected component and a scattered component. The reflected component corresponds to the light component where the incident angle equals the reflected angle. The scattered component corresponds to the light component where the incident angle does not equal the reflected angle. For purposes of discussion hereinafter, the term "reflected" light is meant to encompass either or both the reflected component and the scattered component.

The computer system 430, in conjunction with the manufacturing model 440, adjusts the recipe of the stepper 515 to correct the nonconformity. For example, if he intensity measurement on the periphery 162 of the wafer 105 (see FIG. 1) is greater than the intensity measurement in the middle 164, the line width is presumably less, because a smaller line width causes less scattering. To correct the line width variation, the computer system 430 changes the recipe of the stepper 515 such that the exposure sites (e.g., individual die or groups of die) with smaller line widths receive either an increased energy exposure or a longer duration exposure.

In an alternative embodiment, scatterometry measurements can be made before performing the develop process. Detecting variations and adjusting the stepper 515 recipe prior to the performing the develop process allows for a quicker corrective action response. It is contemplated that all of the wafers 105 in a lot may be tested, or only selected wafers 105 in the lot. Identifying variations early allows correction of wafers 105 within the same lot. For more stable steppers 515, the optical tool 540 may be used only once per shift or once per week, depending on the specific implementation.

In the illustrated embodiment, the photoresist layer 655 is of a chemically-amplified type. In cases where a non-chemically-amplified photoresist material is used, the optical tool 540 may be stationed prior to the oven 520. In a non-amplified photoresist system, the pattern is essentially complete after exposure in the stepper 515. The post exposure bake in the oven 520, which may be optional, is conducted to smooth the edges in the pattern resulting from standing waves, rather than to complete the patterning. Thus, the exposed portions already have an index of refraction different than the unexposed patterns, and the optical tool 540 may be used. Scatterometry measurements can also be made on shallow trench isolation STI) structures. The thickness of silicon dioxide, using tetraethoxysilane (TEOS), used to fill STI structures 240 can be measured using the scatterometry techniques listed above. Scatterometry data is processed and correlated by the system 400. The scatterometry data is then analyzed by the scatterometry error analysis unit 170. The results from the scatterometry error analysis unit 170 can be used to adjust polishing processes of TEOS layers and fillings in STI structures.

Figure 7:
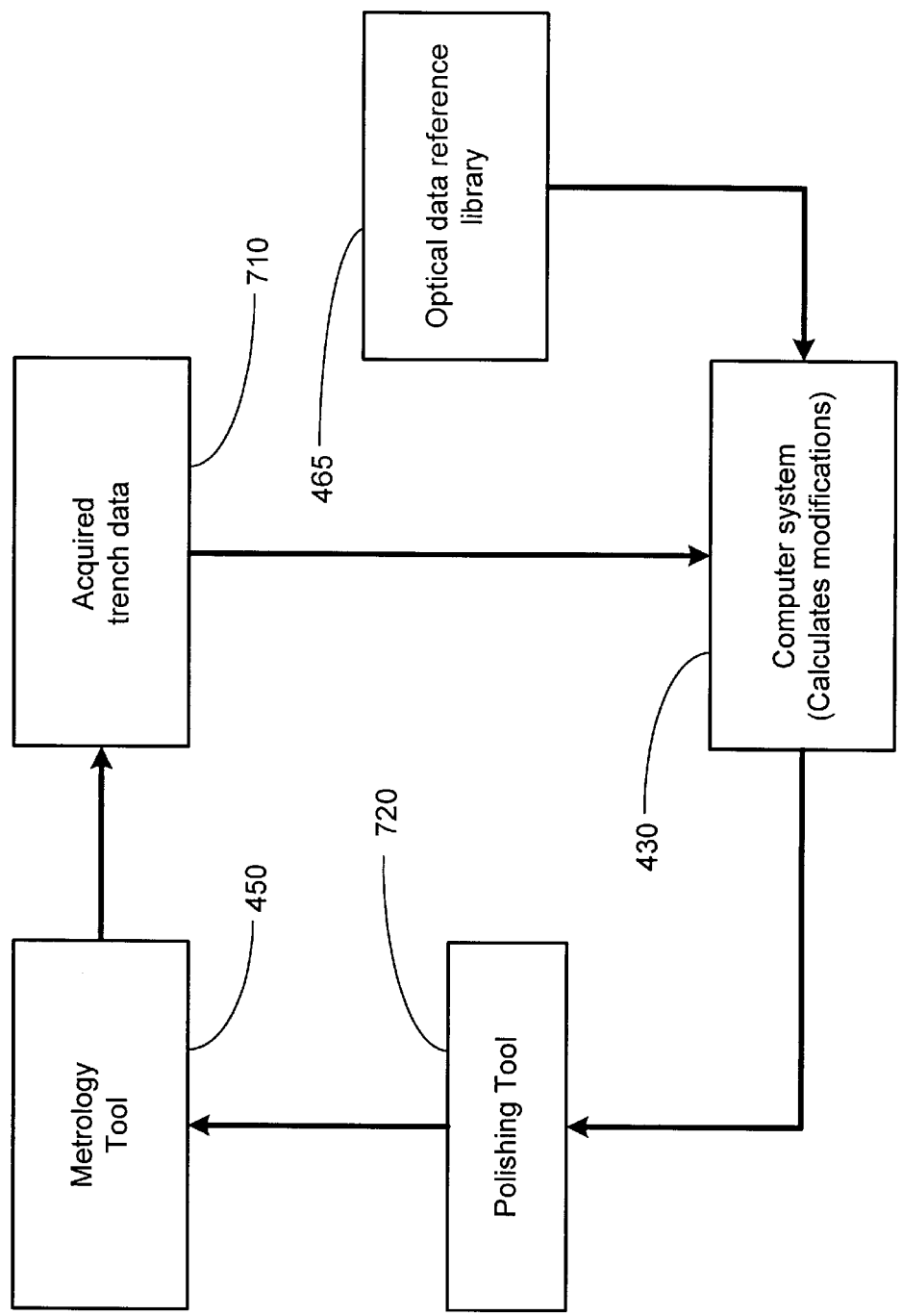
FIG. 7 illustrates block diagram representation of a process feedback path in accordance with one embodiment of the present invention.

Turning now to FIG. 7, a simplified block diagram representation of a feedback flow in accordance with one embodiment of the present invention, is illustrated. The metrology tool 450, which in one embodiment is a scatterometry tool, provides acquired trench data 710 comprising data relating to a thickness of the silicon nitride deposited into a trench. The acquired trench data 710 also includes data relating to the amount of nitride film that has been polished off the semiconductor wafer 105, the dishing parameter indicating the amount of dishing effect in the trench, a field thickness, a field oxide height relative to a nitride height (nitride to FOX step height), and the like. In one embodiment, the acquired trench data 710 is stored in memory. In one embodiment, the system 400 forwards the acquired trench data 710 to the computer system 430. The computer system 430 also receives library data that corresponds to the acquired trench data 710, from the optical data reference library 465. The computer system 430 then compares the library data with the acquired trench data 710 to determine STI structure characteristics.

Figure 3:
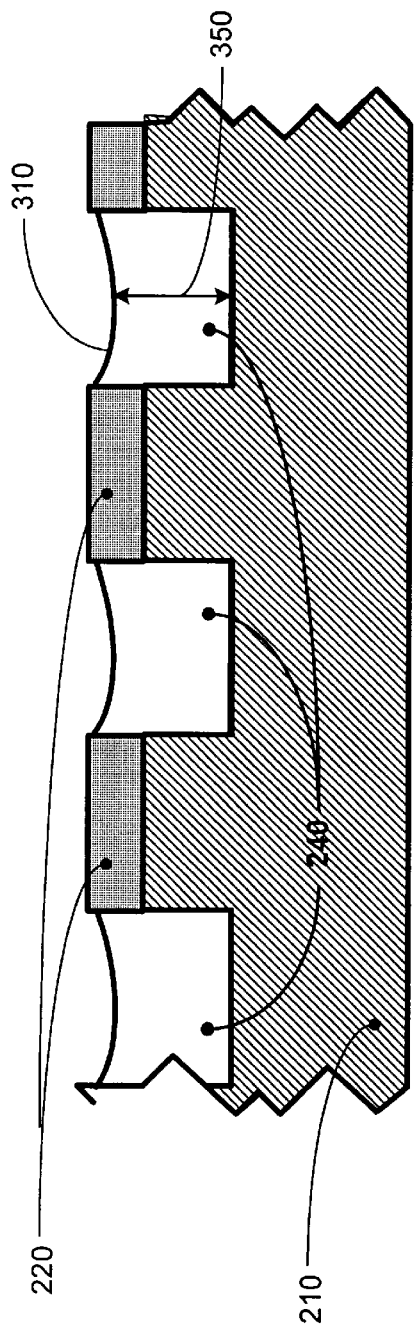
FIG. 3 illustrates a cross-sectional view of the silicon substrate of FIG. 2 where a layer has been subjected to a polish process.

The computer system 430 then calculates modification parameters for subsequent wafer processing. The modification parameters are then sent to the polishing tool 720 to adjust the polishing process performed on the STI structures in order to reduce undesirable polishing process effects, such as dishing. In one embodiment, dishing is defined as an uneven filling of material in a trench. A concave shaped dishing effect 310 is shown in FIG. 3. Turning back to FIG. 7, the wafers 105 that are processed by the polishing tool 720 are then analyzed by the metrology tool 450, repeating the feedback cycle. In one embodiment, the apparatus illustrated in FIG. 7 can be utilized by the system 400 in order to perform depth STI structure fill-depth detection.

Figure 2:
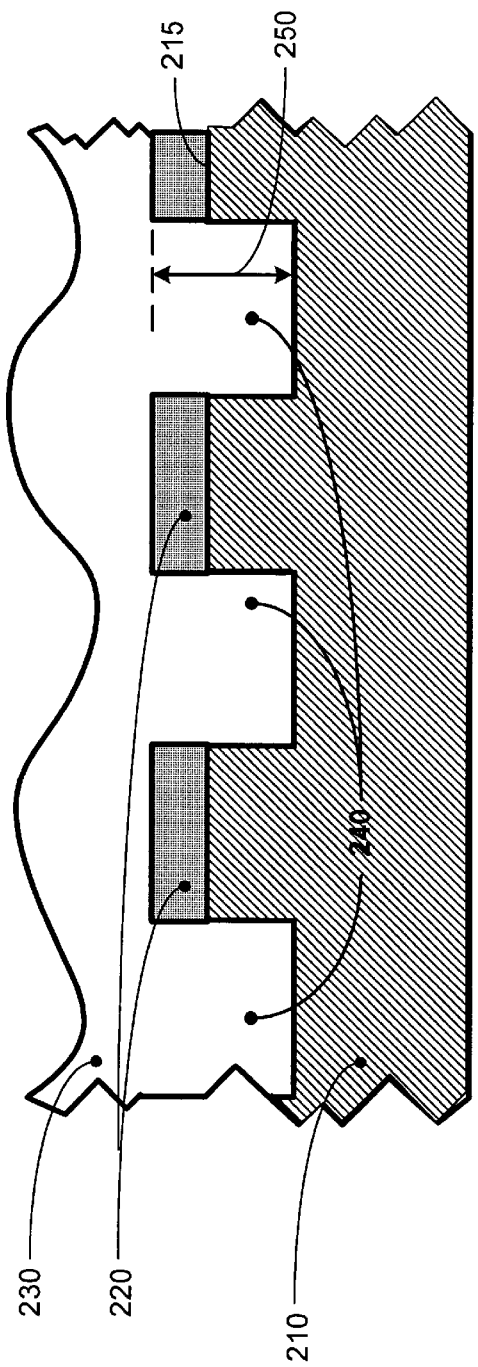
FIG. 2 illustrates a cross-sectional view of a silicon substrate that contains a plurality of layers.
Figure 8:
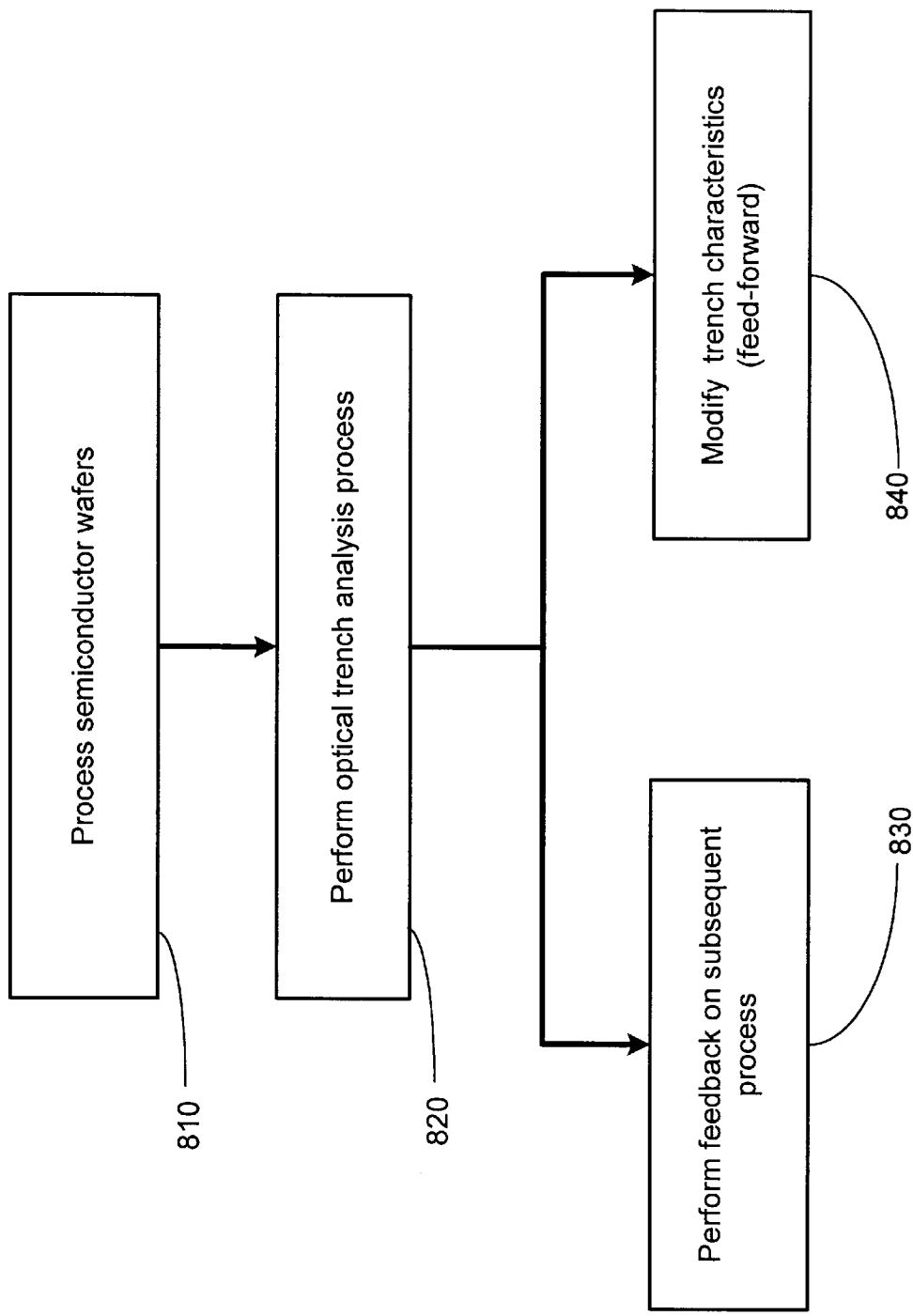
FIG. 8 illustrates a flowchart depiction of a method in accordance with one embodiment of the present invention.

Turning now to FIG. 8, a flow chart depiction of a method in accordance with one embodiment of the present invention is illustrated. At least one semiconductor wafer 105 is processed (block 810). More specifically, the wafer 105 is processed such that a layer of silicon nitride film is formed on a surface of the silicon substrate (see FIGS. 2 and 3). Generally, the silicon nitride film is polished down to a predetermined level. The STI structures 240 are generally built with TEOS. The TEOS is then polished down to approximately the level of the silicon nitride film. Many times, the TEOS is polished too far past the level of the silicon nitride film, or a dishing effect of the TEOS results from inaccurate polishing. The system 400 then performs an optical trench analysis process (block 820). A more detailed flowchart depiction of the steps of one embodiment of performing the optical trench analysis process, is illustrated in FIG. 9.

Figure 9:
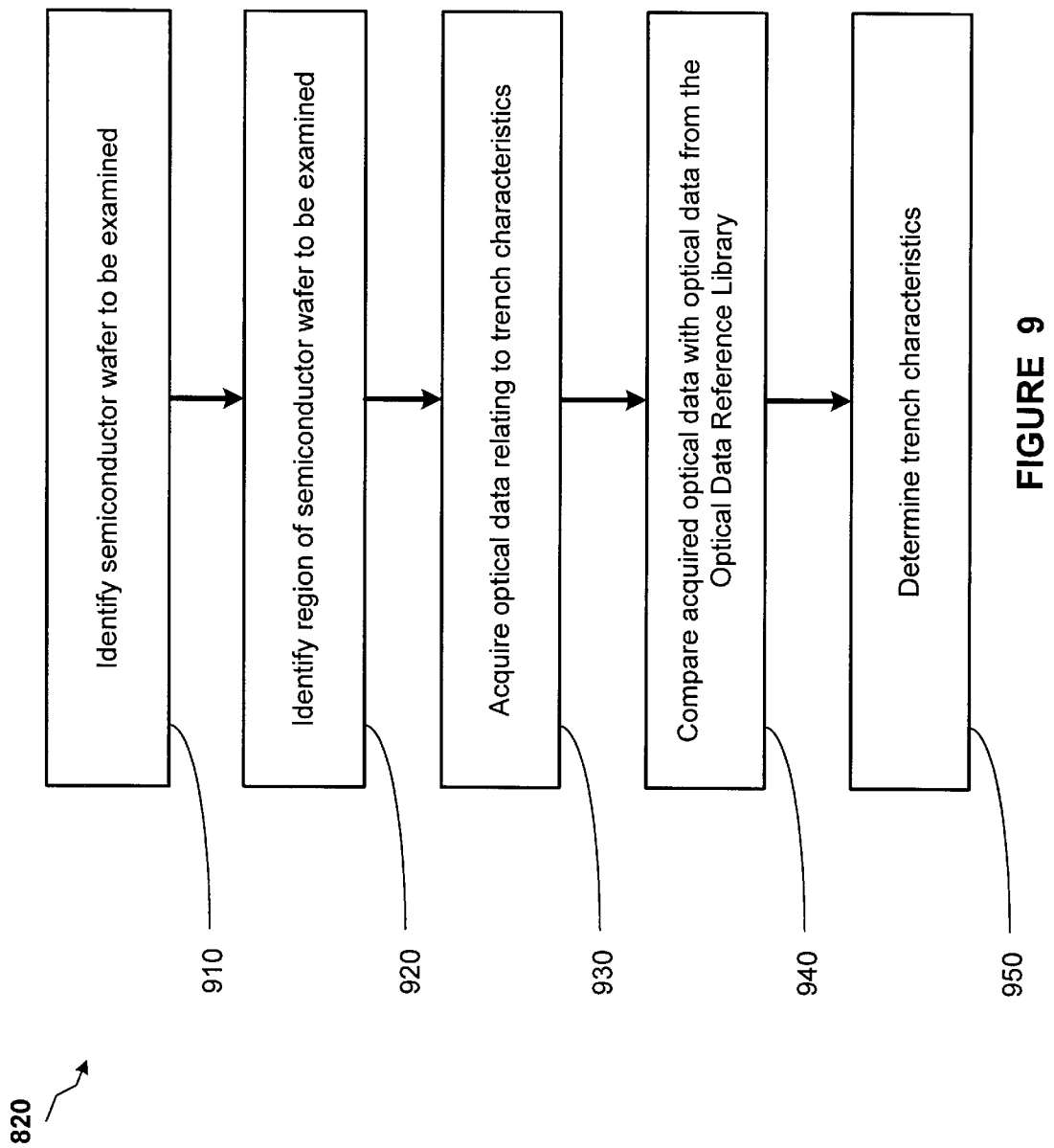
FIG. 9 illustrates a flowchart depiction of a method of performing an optical trench analysis described in FIG. 8, in accordance with one embodiment of the present invention.

Turning now to FIG. 9, the system 400 identifies semiconductor wafers 105 that are to be examined for trench or STI structure analysis (block 910). Furthermore, the system 400 identifies an examination region of the semiconductor wafer 105 that was selected for trench analysis (block 920). Once a region on a semiconductor wafer 105 is selected for trench examination, the system 400 acquires optical data relating to characteristics of the STI structures (block 930). In one embodiment, the optical data acquired comprises scatterometry data. The optical data that is acquired can lead to a determination of trench characteristics such as depth of the silicon nitride deposit, the amount of polishing performed on the silicon nitride or silicon oxide film, at least one dishing parameter, the field thickness, and the like. These trench characteristics can be used to make modifications to subsequent wafer processes.

The acquired optical data relating to the semiconductor wafer 105 being examined is compared with data in the optical data reference library 465 (block 940). The comparison of the acquired optical data and the stored optical data reference library 465 data is used by the system 400 to determine STI structure 240 characteristics of the semiconductor wafer 105 being examined (block 950). The system 400 can be used to compare optical data stored in the optical data reference library 465 with acquired optical data provided by metrology tool 430 in order to estimate the approximate STI structure 240 characteristics of the wafer 105 being examined. In one embodiment, the system 400 compares a sample spectra of the acquired optical data to the data stored in the optical data reference library 465 in order to identify a matched profile. The system 400, in one embodiment, then produces a digitized representation of the matched profile. The matched profile can en be used to approximate an STI structure 240 characteristics of the wafer 105. e completion of the steps described in FIG. 9 substantially completes the process of performing optical trench analysis, which is described in block 820 of FIG 8.

Turning back to FIG. 8, upon performing the optical trench analysis process, n one embodiment, the system 400 performs a feedback correction on subsequent processes (block 830). The feedback of data resulting from optical trench analysis process, can be used by the system 400 to modify subsequent semiconductor manufacturing processes, in order to reduce errors found in semiconductor wafers 105. A flowchart depiction of one embodiment of performing the feedback correction described in block 830 of FIG. 8, is illustrated in FIG. 10.

Figure 10:
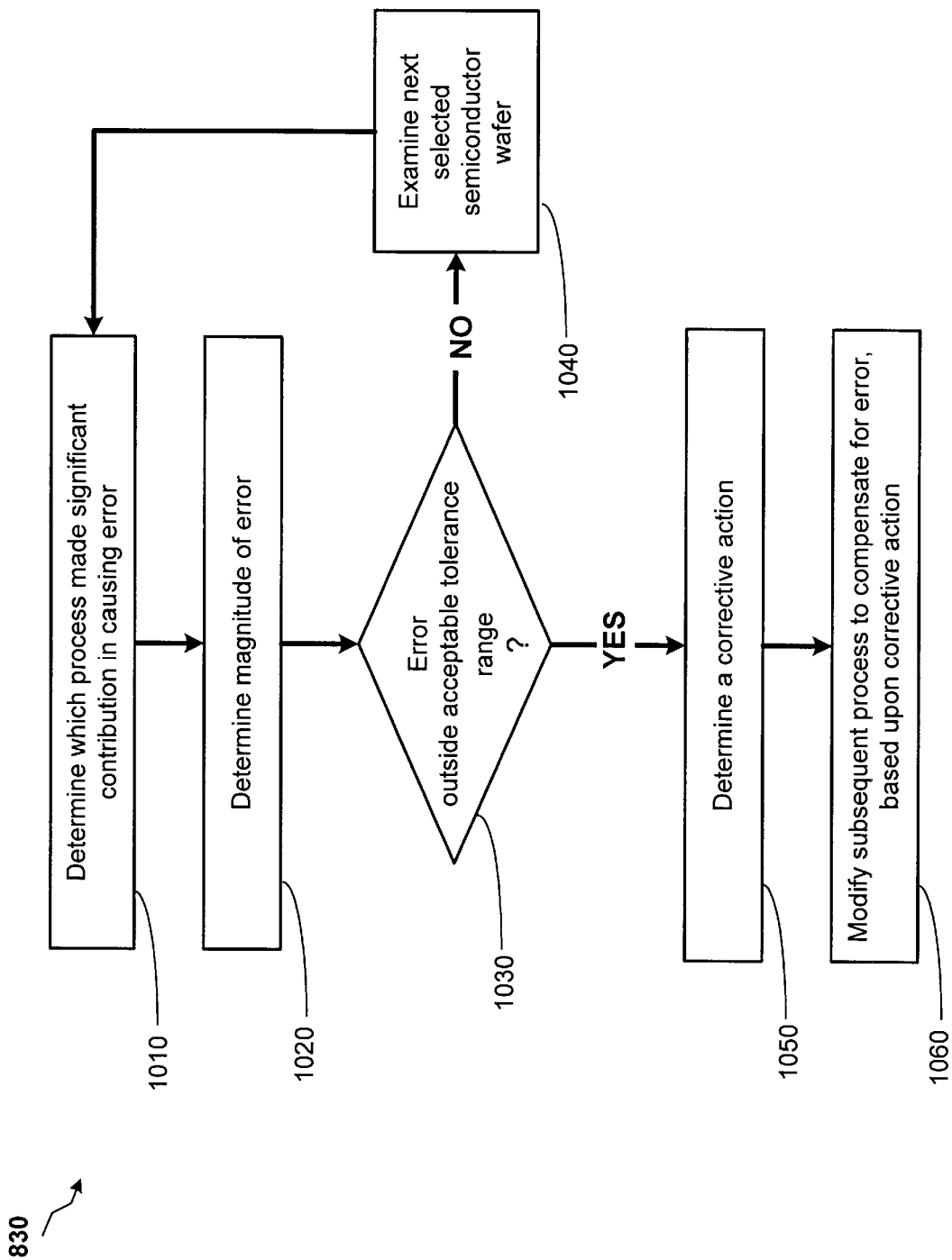
FIG. 10 illustrates a flowchart depiction of a method of performing a feedback process described in FIG. 8, in accordance with one embodiment of the present invention.

Turning now to FIG. 10, a flowchart depiction of one embodiment of performing a feedback correction on subsequent processes using the optical trench analysis, is illustrated. Based upon the optical trench analysis, the system 400 makes a determination as to which particular semiconductor wafer process was likely to have caused the error detected (block 1010). Many times, post-polish process analysis can lead to detection of errors that may have been caused either by a previous polish process or an etch process performed before the polish process. Post-polish error includes trench errors, such as excessive dishing effects. Using the teachings of the present invention, a more global view of the manufacturing environment is possible, such that those skilled in the art who have the benefit of the present disclosure can use the results of the optical trench analysis to determine whether an error was caused by a previous polish operation or a previous etch operation. The system 400 also makes a determination whether the magnitude of the error detected is within a predetermined tolerance range (block 1020, 1030). When the system 400 determines that the error detected is with an acceptable margin of error, the system examines the next selected wafer 105 and repeats the steps described in blocks 1010–1030 (block 1040).

When the system 400 makes a determination that the detected error is outside a predetermined acceptable range, the system 400 determines a corrective action in response to the error (block 1050). In one embodiment, the system 400 modifies the manufacturing model 140 using the computer system 430 to determine possible corrective actions. For example, the system 400 may determine that additional polishing of the TEOS is required to fill the STI structures 240 properly. The system 400 then modifies a subsequent process, (e.g., a chemical-mechanical planarization (CMP) process) in order to compensate for the previous process step that caused the error detected during the trench analysis process (block 1060). The completion of the steps described in FIG. 10 substantially completes the process of performing feedback corrections described in block 830 of FIG. 8. Turning back to FIG. 8, the system 400 can also perform feed forward modifications of trench characteristics in response to the optical trench analysis (block 840). A more detailed flowchart depiction of the process of performing feed-forward modifications in accordance with one embodiment of the present invention, is illustrated in FIG. 11.

Figure 11:
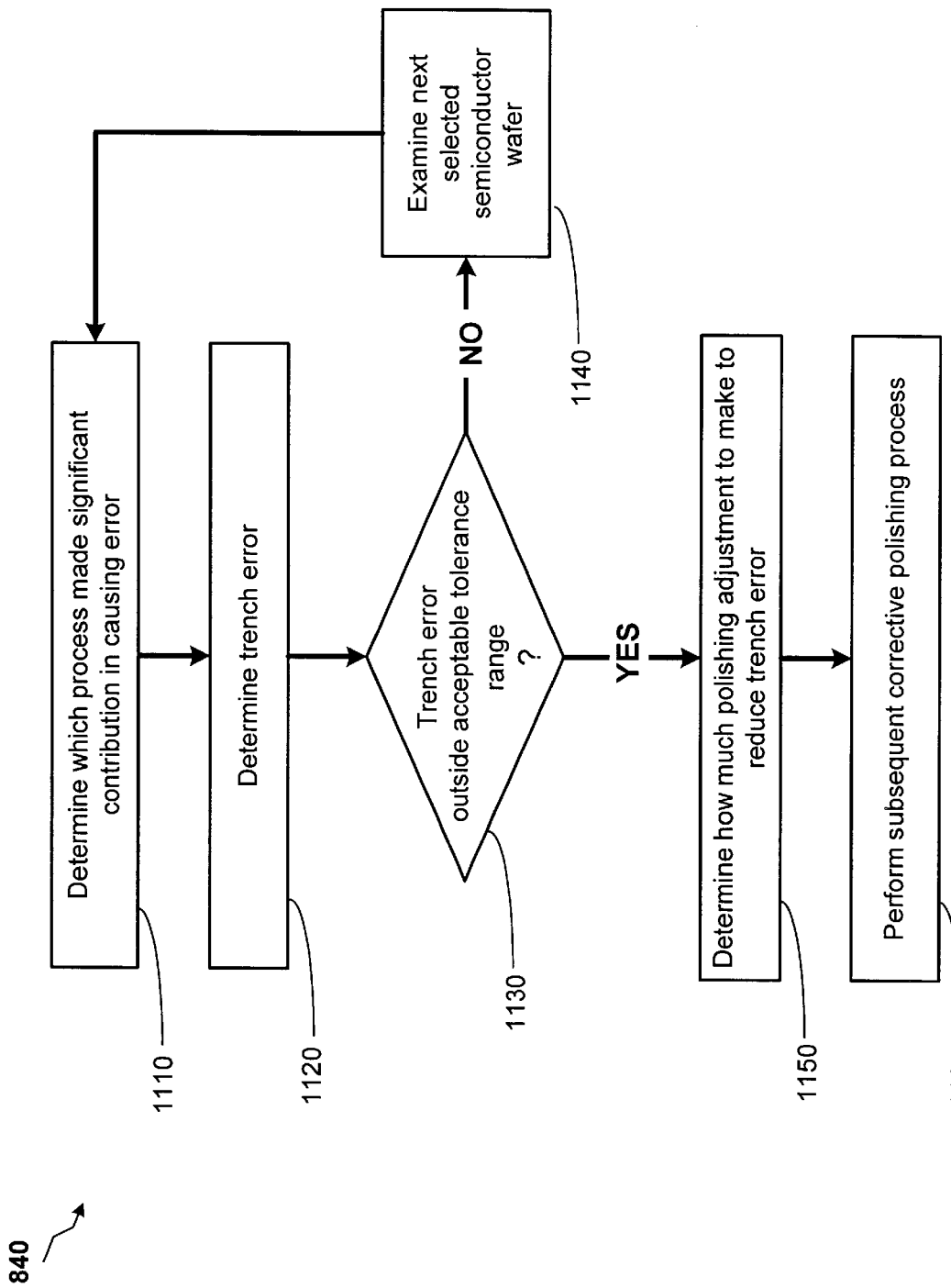
FIG. 11 illustrates a flowchart depiction of a method of performing a feed-forward process described in FIG. 8, in accordance with one embodiment of the resent invention.

Turning now to FIG. 11, in one embodiment, the system 400 determines which previous process was likely to have significantly contributed to the error detected using the optical trench analysis (1110). Using the data acquired by the optical trench analysis, the system 400 calculates the amount of error and the trench characteristics, such as dishing effects (block 1120). The system 400 then makes a determination whether the calculated error is above a predetermined tolerance threshold (block 1130). When the system 400 determines that the detected error is not significant, (i.e., the errors are within a predetermined acceptable range), the system 400 examines the next wafer selected for optical examination (1140).

When the system 400 determines that a significant error has occurred, the system 400 determines the amount of polish process (e.g., CMP process) adjustments to be made in order to reduce the effects of the error (block 1150). In other words, the system 400 may determine that additional polishing is required in order to polish the TEOS down to an approximate level of a layer of silicon nitride deposited on the semiconductor wafer 105 being processed. In one embodiment, the system 400 can perform a corrective action for compensating for previous process errors (e.g., etch process errors, film deposition process errors, etc.,) by modifying a CMP process based on the trench metrology analysis.

The system 400 then performs a subsequent corrective polishing process to reduce the effects of the error detected (block 1160). Utilizing the methods described above, significant amounts of trench errors can be reduced during semiconductor wafer manufacturing processes. Furthermore, the system 400 can use the steps described in FIGS. 8–11 to perform fault detection and implement corrective measures in response to errors detected by the fault detection.

The principles taught by the present invention can be implemented in an Advanced Process Control (APC) Framework. The APC is a preferred platform from which to implement the control strategy taught by the present invention. In some embodiments, the APC can be a factory-wide software system, therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more to sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system. The principles taught by the present invention can be implemented into other types of manufacturing frameworks.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

what is claimed is :

1. A method, comprising:
   performing a first process on at least one semiconductor wafer;
   acquiring optical trench data from said processed semiconductor wafer;
   performing an optical trench analysis based upon said optical trench data; and
   performing a corrective feedback step on a second processing of said semiconductor wafer in response to said optical trench analysis.

2. The method described in claim 1, further comprising generating a reference library that comprises optical data relating to characteristics of a plurality of optical trench data.

3. The method described in claim 1, wherein processing at least one semiconductor wafer comprises performing a polishing process on said semiconductor wafer.

4. The method described in claim 3, wherein performing a polishing process on said semiconductor wafer further comprises performing a chemical-mechanical planarization process on said semiconductor wafer.

5. The method described in claim 1, wherein acquiring optical trench data from said processed semiconductor wafer further comprises acquiring optical data from at least one shallow trench isolation structure on said processed semiconductor wafer.

6. The method described in claim 5, wherein acquiring optical trench data from said processed semiconductor wafer further comprises acquiring scatterometry data.

7. The method described in claim 1, wherein performing an optical trench analysis based upon said optical trench data further comprises:
- identifying a region on said semiconductor wafer for optical analysis;
- acquiring data from an optical data reference library;
- comparing said acquired optical data with data from said optical data reference library; and
- determining at least one trench characteristic based upon said comparison of said acquired optical data and said data from said optical reference library.

8. The method described in claim 7, wherein determining at least one trench characteristic further comprises determining at least one of a depth of a layer of silicon nitride deposit, an amount of polishing performed on a layer of silicon nitride, an amount of polishing performed on a layer of silicon dioxide film, at least one dishing parameter, at least one field thickness, and a field oxide height relative to a nitride height.

9. The method described in claim 1, further comprising performing a feed-forward modification in response to said optical trench analysis.

10. The method described in claim 9, wherein performing a feed-forward modification in response to said optical trench analysis further comprises:
- calculating at least one trench error;
- determining whether said trench error is outside a predetermined tolerance level;
- determining an adjustment for a subsequent polishing process to reduce said trench error in response to a determination that said trench error is outside a predetermined tolerance level; and
- performing a polishing process on said semiconductor wafer based upon said adjustment.

11. The method described in claim 1, wherein performing a corrective feedback step on a second processing of said semiconductor wafer in response to said optical trench analysis further comprises:
- determining a process step that significantly contributed to a process error based upon said optical trench analysis;
- determining whether said process error is outside a predetermined tolerance level;
- determining a corrective action in response to a determination that said process error is outside a predetermined tolerance level; and
- performing a subsequent process step on said semiconductor wafer to implement said corrective action.

12. The method described in claim 11, wherein determining a corrective action further comprises determining a modification of at least one control input parameter.

13. A method, comprising:
- performing a first process on a semiconductor wafer;
- identifying a region on said semiconductor wafer for optical analysis;
- acquiring optical data relating to said region;
- acquiring reference library data corresponding to said optical data; and
- identifying a characteristic of a trench on said semiconductor wafer based upon a comparison between and said optical data and said reference library data.

14. The method of claim 13, further comprising performing a feed-forward correction of a second process performed on said semiconductor wafer based upon said identifying of said characteristic of said trench.

15. The method described in claim 14, wherein performing said feed-forward modification further comprises:
- calculating at least one trench error;
- determining whether said trench error is outside a predetermined tolerance level;
- determining an adjustment for a subsequent polishing process to reduce said trench error in response to a determination that said trench error is outside a predetermined tolerance level; and
- performing a polishing process on said semiconductor wafer based upon said adjustment.

* * * * *

UNITED STATES PATENT AND TRADEMARK OFFICE
CERTIFICATE OF CORRECTION

PATENT NO. : 6,630,362 B1
DATED : October 7, 2003
INVENTOR(S) : Kevin R. Lensing It is certified that error appears in the above-identified patent and that said Letters Patent is hereby corrected as shown below:

Column 1,
Line 66, replace the word "ayer" with -- layer --.

Column 2,
Line 28, replace the word "EOS" with -- TEOS --.

Column 3,
Line 42, replace the word "resent" with -- present --.

Column 6,
Line 58, replace the word "he" with -- the --.

Column 7,
Line 24, replace "STI)" with -- (STI) --.

Column 8,
Line 48, replace the word "en" with -- then --.
Line 50, replace the words "e completion" with -- The completion --.
Line 54, replace the words "n one" with -- in one --.

Column 10,
Line 20, replace the words "more to" with -- more --.

Signed and Sealed this

Sixteenth Day of March, 2004

JON W. DUDAS
*Acting Director of the United States Patent and Trademark Office*